United States Patent [19]

Rao et al.

[11] Patent Number: 5,200,392

[45] Date of Patent: * Apr. 6, 1993

[54] COMPOSITE FOR MAKING SUPERCONDUCTING WIRES OR TAPES

[75] Inventors: A. Srinivasa Rao, Arnold; Om P. Arora, Silver Spring, both of Md.

[73] Assignee: The United States of America as represented by the Secretary of the Navy, Washington, D.C.

[*] Notice: The portion of the term of this patent subsequent to Nov. 5, 2008 has been disclaimed.

[21] Appl. No.: 599,604

[22] Filed: Oct. 18, 1990

[51] Int. Cl.$^5$ ............................................. H01B 12/00
[52] U.S. Cl. ........................................ 505/1; 505/785; 505/740; 505/704; 428/378; 428/471; 428/930; 264/60; 264/66; 75/234; 75/235; 252/514; 252/521; 419/20; 419/21; 419/47
[58] Field of Search .................. 505/785, 740, 1, 704; 428/930, 378, 471; 264/60, 66; 75/234, 235; 252/514, 521; 419/20, 21, 47

[56] References Cited

U.S. PATENT DOCUMENTS

| | | | |
|---|---|---|---|
| 4,826,808 | 5/1989 | Yurek et al. | 505/1 |
| 4,892,861 | 1/1990 | Ray | 505/1 |
| 4,983,574 | 1/1991 | Meyer | 505/704 |
| 4,999,338 | 3/1991 | Wijeyesekera et al. | 505/785 |
| 5,063,201 | 11/1991 | Rao et al. | 505/1 |

OTHER PUBLICATIONS

Sekine et al, "Fabrication of Multifilamentary Y-Ba-Cu-O Oxide Superconductor" *Appl. Phys. Lett.* vol. 52 (26), Jun. 27, 1988, pp. 2261-2262.

*Ceramic Processing*, 1969, pp. 33 and 43.

Chen et al, "Superconductive Aluminum/YBa$_2$Cu$_3$O$_x$ Composites Stabilized by Oxygen/Fluorine Donors", *Appl. Phys. Lett* (52) 16, pp. 1355-1357 Apr. 18, 1988.

Saum et al, "Superconducting Cernet Produced by Electro-Discharge Composition", *High Temp Supercond. Compd.: Process. Relat. Prop. Proc. Symp.*, 273-290 1989.

*Primary Examiner*—Mark L. Bell
*Assistant Examiner*—C. Melissa Bonner
*Attorney, Agent, or Firm*—Gary G. Borda; Howard Kaiser

[57] ABSTRACT

An improved ceramic-plus-metal superconducting composition of YBa$_2$Cu$_3$O$_{6+x}$ plus substantially pure aluminum for ultimate use in making superconducting devices such as wires and tapes for utilization in motors, generators, electric circuits, etc.

6 Claims, No Drawings

COMPOSITE FOR MAKING SUPERCONDUCTING WIRES OR TAPES

The invention described herein may be manufactured and used by or for the Government of the United States of America for Governmental purposes without the payment of any royalties thereon or therefor.

BACKGROUND OF THE INVENTION

1. Field of the Invention

This invention is directed to fine wires or tapes that will behave as superconductors at temperatures above 70° K.

2. Brief Description of the Prior Art

Traditionally the $YBa_2Cu_3O_{6+x}$ superconductor is made by well known ceramic processing method. This conventional method involves grinding yttrium oxide, barium carbonate and copper oxide. This mixture is calcined between 800°–1050° C. The powders after ball milling and mixing are sintered to compact at temperatures in the range 800°–1050° C. followed by annealing at about 400°–600° C. Although the final ceramic shows a sharp superconducting transition at about 85°–90° K., these materials are very hard and brittle. As a result, these materials are very difficult for the rolling operation.

This invention yields a reliable superconductor product as set out below, and in particular improves the superconducting transition temperature and also the ductility of the ceramic.

SUMMARY OF THE INVENTION

This invention provides an improved metal/ceramic composite superconductor composition comprising aluminum and a ceramic compound having the formula $YBa_2Cu_3O_{6+x}$, a mixture of yttrium oxide, barium carbonate and copper oxide proportioned in amounts of about 50 to about 100 gms of $Y_2O_3$, about 175 to about 200 gms of $B_2CO_3$ and about 105 to about 300 gms of $C_uO$ mixture having been ball milled with zirconia balls for at least one hour, calcined at 940° C. + or − 2° C. with a heating sequence of about 3° C. to about 5° C. per minute, said temperature being maintained for about 300 to about 600 minutes, the mixture having been cooled to room temperature at the rate of about 3° C. to about 5° C. per minute and ground into a fine powder using zirconia balls, the mixture having then been heated to about 700° C. at the rate of about 5° C. per minute and cooled to about 550° C.–600° C. for 300 minutes in a flowing oxygen environment, the mixture then having been annealed at 550° C.–600° C. for 300 minutes in a flowing oxygen environment, the mixture then having been cooled to room temperature at the rate of about 1° C. per minute, then the mixture having been mixed with substantially pure aluminum in proportioned amounts of about 40 to about 45 weight percent ceramic compound and about 55 to about 60 weight percent substantially pure aluminum.

OBJECTS OF THE INVENTION

It is therefore an object of the present invention to improve the ductility of superconducting $YBa_2Cu_3O_{6+x}$+aluminum with transition temperature up to 85°–88° K.

A further object of the present invention is to utilize specific sequences of rolling, heat treating times and temperatures in conjunction with the use of pure aluminum powder to improve the ductility and superconductivity.

With other objects in view, this invention provides a method for making an improved ceramic superconductor by combining rolling, heat treatment sequence with the addition of pure aluminum powder.

DETAILED DESCRIPTION OF THE INVENTION

The present invention provides a unique composition and method for making devices, such as thin wires or tapes, of improved superconducting $YBa_2Cu_3O_{6+x}$+ aluminum ceramic/metal material. One specific example of the invention provides a composition, provided by a method for improving the ductility of the superconducting ceramic powder with aluminum addition. It is observed that using rolling or heat treatment sequence without aluminum addition or using aluminum addition without heat treating sequence will not yield the improvement.

The $YBa_2Cu_3O_{6+x}$ superconductor composition-by-process example is made by mixing yttrium oxide, barium carbonate and copper oxide in a preferable ratio of amounts of about 100 gm of $Y_2O_3$ to 200 gm of $BaCO_3$ to 300 gm of CuO, which produces excess amounts of unreacted CuO; in this example, the stoichiometry is 1 mol $Y_2O_3$+2 mol BaO+8 mol CuO (this stoichiometry alternatively stated as $YBa_2Cu_3O_{6+x}$.5 CuO), thus having an unreacted excess amount of 5 mol CuO. Other ratios such as 100 gm $Y_2O_3$ to 340 gm $BaCO_3$ to 210 gm CuO also work well; Here, the stoichiometry is 1 mol $Y_2O_3$+2 mol $BaO$+3 mol CuO however, the quality is not as good as the former recipe. The mixture of these three (3) compounds is then ball milled with zirconia balls for at least one hour. The mixture, after ball milling, is calcined at 940° C. + or − 2° C. with a specific heating sequence of 3° C. per minute. The mixture is maintained at 940° C. for 300–600 minutes, depending upon the total amount to be reacted. When the mixture is spread on a sheet and exposes more surface, the total time for reaction will be about 300 minutes. The calcined powder is cooled at the rate of 3° C. per minute to the room temperature and is ground into fine powder using zirconia balls. Substantially pure aluminum powder and $YBa_2Cu_3O_{6+x}$ proportioned in the amounts 60 gm aluminum to 40 gm $YBa_2Cu_3O_{6+x}$ are mixed throughly in a ball mill using zirconia or alumina balls for at least one hour. Two different processing methods can be utilized, depending upon the application, for the improved ceramic superconductor composition thus yielded.

Process 1. The 60 wt. % aluminum and 40 wt. % $YBa_2Cu_3O_{6+x}$ are dry pressed under 25000 psi into a cylinder or bar. The cold pressed bar or rod is heated in a press maintained under a pressure of 25,000 psi to about 350° C.–400° C. for one hour. The sample is cooled and the pressed material is used for hot rolling into a fine tape or wire. An excellent superconducting tape or wire is produced.

Process 2. The 60 wt. % aluminum and 40 wt. % $YBa_2Cu_3O_{6+x}$ composition is introduced into an aluminum tube. After the two open ends of the tube are tightly sealed the composition is cold rolled to produce tape of desired thickness (tapes thinner than 10 mils can be rolled very easily). The aluminum tube containing the above-mentioned powder can be swaged very easily in order to obtain wire of less than 1 mm in diameter.

Other forming processes such as hot rolling, or hot extrusion also work well.

Rolled tapes or wires obtained from the above two process are then annealed in flowing oxygen at about 425°–475° C. for about 2 hours. This annealing process not only relieves the strain in the tapes or wires but also improves the oxygen stoichiometry of the ceramic/metal superconductor composition, $YBa_2Cu_3O_{6+x}$ plus aluminum. Annealing above 500° C. degrades the electrical properties of the tape or wire.

The advantages and new features of the invention are that combining the rolling or swaging or extrusion and annealing procedures with the addition of pure aluminum powder at the given composition to the $YBa_2Cu_3O_{6+x}$ superconductor results in a superconductor that has substantially the same or slightly higher superconducting transition temperatures in the range of about 85° K. to about 88° K. In addition it also shows considerably lower resistance up to much higher temperatures e.g., on the order of $1.6 \times 10^{-6} \Omega$-cm at room temperature. An additional advantage of this invention derives from latitude in initially measuring out the yttrium oxide, barium carbonate and copper oxide; these ingredients do not have to be strictly proportioned at the outset so as to produce pure $YBa_2Cu_3O_{6+x}$ only. The resulting ceramic superconducting composition is very ductile; as a result, it is very easy to form or machine into any required shape. The improved properties of the new superconductor improve the reliability of any wire, tape or electric device or other product made thereof.

What is claimed is:

1. An improved metal plus ceramic superconducting wire or tape comprising:
   a metal plus ceramic superconductor composite having a superconducting transition temperature of about 85° K. to about 88° K., and further wherein the resistance of said superconductor composite at room temperature is about $1.6 \times 10^{-6} \Omega$-cm;
   said superconductor composite composed of a combination of about 60 weight percent of substantially pure aluminum and about 40 weight percent of a superconducting ceramic compound;
   said superconducting ceramic compound composed of a mixture of about 100 grams of $Y_2O_3$, about 200 grams of $BaCO_3$ and about 300 grams of $CuO$, said superconductor ceramic compound further having the formula $YBa_2Cu_3O_{6+x}$;
   said metal plus ceramic superconducting wire or tape produced by the process comprising the steps of:
   mixing yttrium oxide, barium carbonate and copper oxide to produce a mixture of about 100 grams of $Y_2O_3$, about 200 grams of $BaCO_3$ and about 300 grams of $CuO$;
   ball milling said mixture for at least one hour;
   calcining said mixture at a temperature of 940° C. + or −2° C. with a heating sequence of about 3° C. to about 5° C. per minute, said temperature being maintained for about 300 to about 600 minutes;
   cooling said mixture to room temperature at the rate of about 3° C. to about 5° C. per minute;
   grinding said mixture into a fine powder;
   heating said mixture to a temperature of about 700° C. at the rate of about 5° C. per minute;
   cooling said mixture, for about 300 minutes in a flowing oxygen environment, to a temperature of about 500° C. to 600° C.;
   annealing said mixture at a temperature of about 550° C. to 600° C. for about 300 minutes in a flowing oxygen environment;
   cooling said mixture to room temperature at a rate of 1° C. per minute, wherein the above steps produce said superconducting ceramic compound;
   combining said superconducting ceramic compound with said substantially pure aluminum by mixing about 60 weight percent of substantially pure aluminum powder and about 40 weight percent of said superconducting ceramic compound;
   ball milling said combination for at least one hour to produce said superconductor composite; and
   processing said superconductor composite into said metal plus ceramic superconducting wire or tape.

2. An improved metal plus ceramic superconducting wire or tape as in claim 1 wherein said processing of said superconductor composite into said superconducting wire or tape further comprises the steps of:
   cold pressing said superconductor composite under a pressure of about 25,000 psi to form a rod or bar;
   hot pressing said rod or bar under a pressure of about 25,000 psi to a temperature of about 350° C. to 400° C. for about one hour;
   cooling said rod or bar;
   forming said rod or bar into said superconducting wire or tape by rolling said rod or bar; and
   annealing said superconducting wire or tape at a temperature of about 425° C. to 475° C. for about two hours in a flowing oxygen atmosphere.

3. An improved metal plus ceramic superconducting wire or tape as in claim 1 wherein said processing of said superconductor composite into said superconducting wire or tape further comprises the steps of:
   introducing said superconductor composite into an aluminum tube;
   sealing the ends of said aluminum tube
   forming said tube into said superconducting wire or tape by rolling, swaging or extruding said tube; and
   annealing said superconducting wire or tape at a temperature of about 425° C. to 475° C. for about two hours in a flowing oxygen atmosphere.

4. A method for producing a metal plus ceramic superconducting wire or tape composed of a combination of substantially pure aluminum and a superconducting ceramic compound, said superconducting ceramic compound composed of a mixture of about 100 grams of $Y_2O_3$, about 200 grams of $BaCO_3$ and about 300 grams of $CuO$, said superconductor ceramic compound further having the formula $YBa_2Cu_3O_{6+x}$, said method comprising the steps of:
   mixing yttrium oxide, barium carbonate and copper oxide to produce a mixture of about 100 grams of $Y_2O_3$, about 200 grams of $BaCO_3$ and about 300 grams of $CuO$;
   ball milling said mixture for at least one hour;
   calcining said mixture at a temperature of 940° C. + or − 2° C. with a heating sequence of about 3° C. to about 5° C. per minute, said temperature being maintained for about 300 to about 600 minutes;
   cooling said mixture to room temperature at the rate of about 3° C. to about 5° C. per minute;
   grinding said mixture into a fine powder;
   heating said mixture to a temperature of about 700° C. at the rate of about 5° C. per minute;
   cooling said mixture, for about 300 minutes in a flowing oxygen environment, to a temperature of about 500° C. to 600° C.;

annealing said mixture at a temperature of about 550° C. to 600° C. for about 300 minutes in a flowing oxygen environment;

cooling said mixture to room temperature at a rate of 1° C. per minute, wherein the above steps produce said superconducting ceramic compound;

combining said superconducting ceramic compound with said substantially pure aluminum by mixing about 60 weight percent of substantially pure aluminum powder and about 40 weight percent of said superconducting ceramic compound;

ball milling said combination for at least one hour to produce a superconductor composite wherein said superconductor composite has a superconducting transition temperature of about 85° K. to about 88° K., and further wherein the resistance of said superconductor composite at room temperature is about $1.6 \times 10^{-6} \Omega$-cm; and processing said superconductor composite into said metal plus ceramic superconducting wire or tape.

5. A method for producing a metal plus ceramic superconducting wire or tape as in claim 4 wherein said processing of said superconductor composite into said superconducting wire or tape further comprises the steps of:

cold pressing said superconductor composite under a pressure of about 25,000 psi to form a rod or bar;

hot pressing said rod or bar under a pressure of about 25,000 psi to a temperature of about 350° C. to 400° C. for about one hour;

cooling said rod or bar;

forming said rod or bar into said superconducting wire or tape by rolling said rod or bar; and annealing said superconducting wire or tape at a temperature of about 425° C. to 475° C. for about two hours in a flowing oxygen atmosphere.

6. A method for producing a metal plus ceramic superconducting wire or tape as in claim 4 wherein said processing of said superconductor composite into said superconducting wire or tape further comprises the steps of:

introducing said superconductor composite into an aluminum tube;

sealing the ends of said aluminum tube;

forming said tube into said superconducting wire or tape by rolling, swaging or extruding said tube; and annealing said superconducting wire or tape at a temperature of about 425° C. to 475° C. for about two hours in a flowing oxygen atmosphere.

* * * * *